United States Patent [19]
Weng

[11] Patent Number: 5,237,574
[45] Date of Patent: Aug. 17, 1993

[54] ERROR-RESILIENT INFORMATION ENCODING

[75] Inventor: Lih-Jyh Weng, Lexington, Mass.

[73] Assignee: Digital Equipment Corporation, Maynard, Mass.

[21] Appl. No.: 808,035

[22] Filed: Dec. 11, 1991

Related U.S. Application Data

[63] Continuation of Ser. No. 179,646, Apr. 8, 1988, abandoned.

[51] Int. Cl.[5] .......................................... G06F 20/18
[52] U.S. Cl. .................................. 371/40.1; 360/49; 371/37.4
[58] Field of Search ............... 371/37.4, 37.7, 40.1; 360/49

[56] References Cited

U.S. PATENT DOCUMENTS

| | | | |
|---|---|---|---|
| 3,638,182 | 1/1972 | Burton et al. | 340/146.1 |
| 4,413,339 | 11/1983 | Riggle et al. | 371/38 |
| 4,413,340 | 11/1983 | Odaka et al. | 371/39 |
| 4,503,420 | 3/1985 | Rub et al. | 340/347 |
| 4,598,403 | 7/1986 | Odaka | 371/39 |
| 4,750,178 | 6/1988 | Sako et al. | 371/37.4 |
| 4,769,819 | 9/1988 | Matsutani et al. | 371/37.4 |
| 4,847,705 | 7/1989 | Weng et al. | 360/49 |
| 4,955,022 | 9/1990 | Odaka | 371/37.4 |

FOREIGN PATENT DOCUMENTS

WO83/01334 4/1983 European Pat. Off.
0205667 12/1986 European Pat. Off.
0248536 9/1987 European Pat. Off.

OTHER PUBLICATIONS

Rao, T., et al., *Error-Control Coding for Computer Systems*, Prentice-Hall, pub. 1989, pp. 330-336.
Lin et al., *Error Control Coding*, copyright 1983, pp. 274-278.

Primary Examiner—Stephen M. Baker
Attorney, Agent, or Firm—Fish & Richardson

[57] ABSTRACT

A method for determining whether particular information was used in encoding a codeword; the codeword is formed by encoding information as a first preliminary code sequence using a first code and then combining the first preliminary code sequence with a second preliminary code sequence generated using a second code; the particular information is encoded as a desired first preliminary code sequence in accordance with said first code; the desired first preliminary code sequence is then stripped from the codeword to derive a test sequence; the test sequence is decoded in accordance with the second code, and a determination is made, based on the decoding, whether the particular information was used in encoding the codeword. In another aspect, bad sector, servo correction, and sector address values are encoded for storage in a header associated with a sector of storage on a storage medium by encoding the address value with leading zero symbols in accordance with a code having a first rate, encoding the bad sector and servo correction values in a systematic code having a second rate, and combining these sequences to generate a codeword of the first code such that the bad sector and servo correction values appear explicitly in the codeword.

24 Claims, 8 Drawing Sheets

ERROR-RESILIENT INFORMATION ENCODING

This is a continuation of application Ser. No. 07/179,646, filed Apr. 8, 1988, now abandoned.

BACKGROUND OF THE INVENTION

This invention relates to method for encoding information and for locating, reading, and writing information stored on a disk.

In systems that store data on sectors of a magnetic disk, the stored header that identifies each sector may be encoded to reduce the effect of bit errors that occur in recording. The header typically includes an address that uniquely identifies the sector and may include additional information, such as a bad sector flag and a servo correction number. To locate a particular sector on a specified track of the disk and to read or write data in that sector, the header of each sector along that track must be read and analyzed quickly.

To determine if a sector is the one being sought the sector address on the disk is read and compared with the specified address of the desired sector in which data is to be read or written. If the addresses match, the data will be read from or written to the sector.

If a sector address read from the disk has errors, the sector may be mistakenly identified, causing the disk drive to incorrectly determine, for example, that the head is located over sector 100 when it is actually located over sector 101. As a result, the read or write operation that is to occur at sector 100 will be performed on the wrong sector. If a sector address contains several errors or the address is corrupted due to a medium defect or soft error in the disk, the sector address may be unreadable making the sector unusable.

To avoid misinterpreting the address of a sector, the sector addresses must be written on the disk in such a way that even with a number of errors in the address, it will neither be read as the address of a different sector nor be rendered unidentifiable.

SUMMARY OF THE INVENTION

The invention features methods for quickly locating sectors on a magnetic disk, finding bad sectors on the disk, and centering a head on a track of the disk. The address of each sector is encoded as a first preliminary code sequence in accordance with a first code. A second preliminary code sequence is generated from bad sector information and servo control information about the location of the center of the track, in accordance with a second code. A code word is formed based on combining the first and second preliminary code sequences, and the codeword is recorded in the sector during formatting of the disk. The codeword, possibly corrupted, is read from each sector of the track rotating under the head. The first preliminary code sequence is stripped from the possibly corrupted codeword to derive a test sequence comprising a possibly corrupted version of the second preliminary code sequence. The test sequence is decoded in accordance with the second code to determine the number of errors in the corrupted codeword. The number of errors are compared to a threshold T. If the number of errors is no greater than T, the sector is accepted as the one being sought. Note that the sector address does not even need to be fully decoded; the information about the number of errors relative to T is sufficient to determine whether or not the desired sector has been reached. If decoded bad sector information indicates a bad sector, no write operation will be performed in that sector. The servo control information is used to control the position of the head.

Another general feature of the invention is encoding bad sector, servo correction, and sector address values for storage in a header associated with a sector of storage in a storage medium; the address value with leading zero symbols is encoded in accordance with a code of a first rate; the bad sector and servo correction values are encoded in a systematic code having a second rate; and the first and second preliminary code sequences are combined to generate a codeword of the first code such that the bad sector and servo correction values appear explicitly in the codeword but the sector address value does not appear explicitly in the codeword.

Another general feature of the invention encodes information in a codeword that may be subjected to no more than a predetermined degree of corruption, and then, without fully decoding a corrupted version of the codeword, determines from the corrupted codeword whether the information was used in encoding the codeword; the information is encoded as a first preliminary code sequence in accordance with the first code; the codeword is formed by combining the first preliminary code sequence with a second preliminary code sequence generated in accordance with a second code; the first preliminary code sequence is stripped from the corrupted version of the code word to derive a test sequence comprising a corrupted version of possibly the second preliminary code sequence; the test sequence is decoded in accordance with the second code; and determination is made based on the decoding whether the information was used in encoding the codeword.

Preferred embodiments of the invention include the following features.

The legitimate code sequences of the second code are a subset of the legitimate code sequences of the first code. The first code is not systematic with respect to the information. The first code is a cyclic error correcting $(n,k)$ code, and the second code is a cyclic error correcting $(n,m)$ code, where m is smaller than k. The second code is susceptible to being fully decoded by permutation decoding but the first code is not susceptible to being fully decoded by permutation decoding. The first and second codes are respectively $(33,8)$ and $(33,2)$ Reed-Solomon codes, each code symbol being 5 bits long.

The method may be further adapted for encoding additional information in the codeword such that, without fully decoding the corrupted version of the codeword, the additional information may be fully reconstructed from the corrupted codeword; the additional information is encoded in the second preliminary code sequence; and the additional information is then reconstructed based on the decoding of the test sequence series.

The information includes an address of a block (e.g., a sector of a magnetic disk) of data on a recording medium. The additional information includes a bad sector flag and a servo correction number.

The method further includes combining the codeword with a coset leader and removing the coset leader from the corrupted codeword prior to stripping off the first preliminary code sequence. The second code is systematic with respect to the additional information. The codeword is a string of n symbols, the high order m said symbols being the additional information. The first preliminary code sequence is a string of n symbols, the high order k said symbols comprising at least one zero symbol followed by the information.

The decoding includes permutation decoding over a field of finite elements having fewer elements than the field that would be required for fully decoding the corrupted codeword. The determination of whether the information was used in encoding the codeword includes detecting the distance between the test sequence and legitimate codeword. The distance is compared with a predetermined threshold value whose maximum is smaller than the error correcting capability of the second code and equal to the error correcting capability of the first code. The decoding of the test sequence includes encoding simultaneously in parallel, in accordance with the second code, all possible code sequences corresponding to each possible value of the additional information, and comparing simultaneously in parallel each possible code sequence with the test sequence.

The first and second codes are maximum distance separable codes, the first code having a smaller distance than the second code.

The invention enables rapid, accurate determination that the desired sector has been reached, while permitting quick reconstruction of the bsf and scn values. The decoding can be accomplished by simple permutation decoding even though the code in which the address information is encoded could not be fully decoded by permutation decoding. The decoding can proceed over a smaller field of elements than would be required for fully decoding the complete codeword. In cases where parallel decoding is used, it is relatively efficient and simple.

Other advantages and features will become apparent from the following description of the preferred embodiment and from the claims.

DESCRIPTION OF THE PREFERRED EMBODIMENT

We first briefly describe the drawings.

STRUCTURE AND OPERATION

Figure 1:
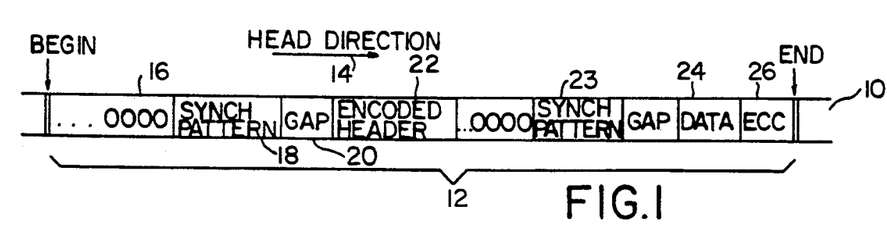
FIG. 1 is a diagram of a sector on a track of a disk.

Referring to FIG. 1, each track 10 of a magnetic disk is divided into sectors on which bits are recorded. Each sector 12 includes a sequence of fields that are scanned in order by a read head moving in the direction indicated by arrow 14. The first field is a string of leading zeroes 16 used by a phase locked loop in a disk controller (not shown) to synchronize the operation of the read head with the bit spacing along the track. The second field 18 is a synchronization pattern which indicates that the data will appear next on the track. A short gap 20 follows the synchronization pattern. Next comes the data itself, including an encoded header 22, a second synchronization pattern 23 (preceded by leading zeroes and followed by a gap), data 24 (e.g. user data), and error correction code bits 26 which apply to the data in field 24.

Figure 2:
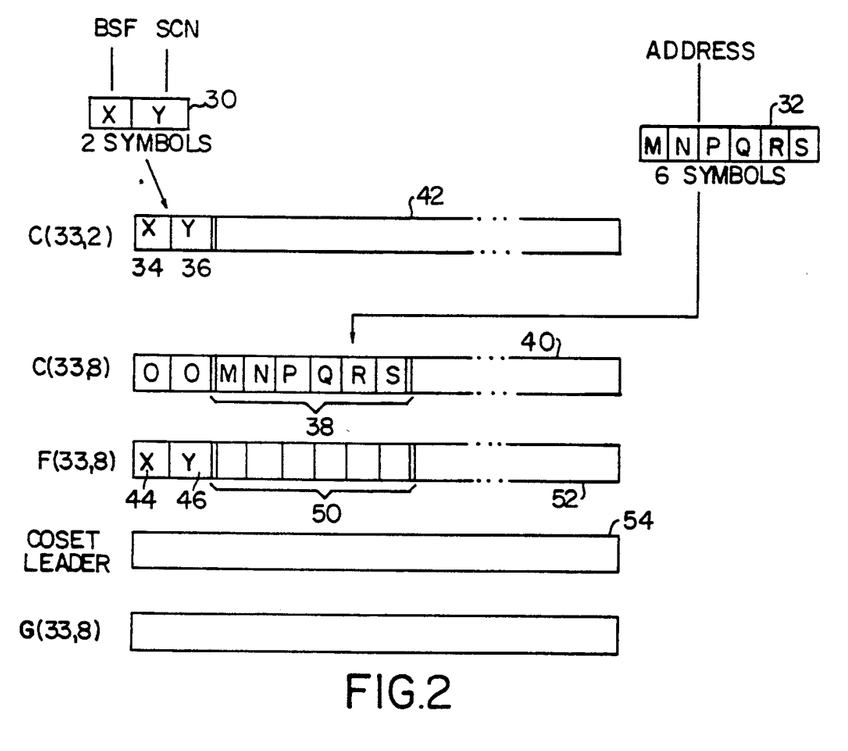
FIG. 2 is a diagram of codewords.
Figure 3:
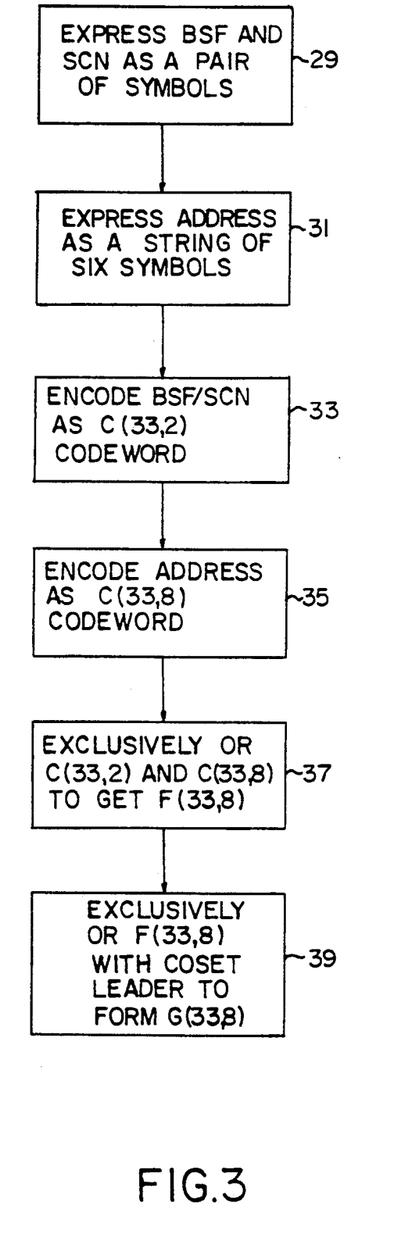
FIG. 3 is a flow chart of codeword generation.

Referring to FIGS. 2, 3, the encoded header for a given sector (which is prerecorded on the disk at the time of manufacture or formatting) is encoded using the address, bsf (bad sector flag), and scn (servo correction number) values that pertain to that sector by the following procedure.

First, the bsf and scn values are expressed (29) as a pair of 5-bit symbols 30 and the address is expressed (31, FIG. 3) as a string of six 5-bit symbols 32. Next, the bsf/scn symbol pair 30 is encoded (33) as a codeword C(33,2) in a Reed-Solomon maximum distance separable and cyclic (33,2) distance 32 code, (described below). By nature of the code used, the codeword C(33,2) has two leading symbols 34, 36 (identical to the bsf/scn symbol pair 30) followed by thirty-one 5-bit redundancy symbols 42.

Next, the six symbol address string 32 is encoded (35) as a (33,8) distance 26 Reed Solomon codeword, C(33,8). The code (described below) is arranged such that C(33,8) has two leading zero-valued symbols, followed by a six symbol string 38 (identical to string 32) followed by twenty-five redundancy symbols 40.

Next, the preliminary code sequences C(33,2) and C(33,8) are exclusively ORed (37) to form a composite codeword F(33,8). F(33,8) comprises two leading symbols 44, 46 identical to the bsf/scn symbol pair, followed by six symbols 50 in which both redundancy and address information are imbedded (in this sense F(33,8) is not systematic). The remaining twenty-five symbols 52 are imbedded with redundancy information from both C(33,2) and C(33,8). F(33,8) is a codeword in the original (33,8) code because both C(33,8) and C(33,2) are codewords in the (33,8) code. Note that the codes are designed so that every (33,2) codeword is in the (33,8) code.

Next, F(33,8) is exclusively ORed (39) with a thirty-three symbol coset leader 54 to form an adjusted final codeword G (33,8). The coset leader is chosen to reduce the chance of mistaken bit and/or symbol synchronization during decoding. One example of a good coset leader is $\text{alpha}^0 * X^{24}$ (+) $\text{alpha}^8 * X^{23}$ (+) $\text{alpha}^{25} * X^{22}$ (+) $\text{alpha}^3 * X^{21}$ (+)

$\text{alpha}^5 * X^{20}$ (+) $\text{alpha}^9 * X^{19}$ (+) $\text{alpha}^{20} * X^{18}$ (+) $\text{alpha}^{10} * X^{17}$ (+)

$\text{alpha}^4 * X^{16}$ (+) $\text{alpha}^{28} * X^{15}$ (+) $\text{alpha}^9 * X^{14}$ (+) $\text{alpha}^8 * X^{13}$ (+)

$\text{alpha}^8 * X^{12}$ (+) $\text{alpha}^9 * X^{11}$ (+) $\text{alpha}^{28} * X^{10}$ (+) $\text{alpha}^4 * X^9$ (+)

$\text{alpha}^{10} * X^8$ (+) $\text{alpha}^{20} * X^7$ (+) $\text{alpha}^9 * X^6$ (+) $\text{alpha}^5 * X^5$ (+)

$\text{alpha}^3 * X^4$ (+) $\text{alpha}^{25} * X^3$ (+) $\text{alpha}^8 * X^2$ (+) $\text{alpha}^0 * X^1$ The coset leader has no terms for $X^{25}$ through $X^{32}$ and thus does not alter the high order eight symbols of F(33,8).

The (33,8) distance 26 code is a code over a Galois field $GF(2^5)$ generated by the primitive polynomial $x^5$ (+) $x^4$ (+) $x^3$ (+) $x^2$ (+) 1 where (+) denotes exclusive OR, and x denotes an indeterminate or variable. GF($2^5$) may be represented by the following 32 elements:

| | | | |
|---|---|---|---|
| 0 = (00000), | alpha$^0$ = (00001), | alpha$^1$ = (00010), | alpha$^2$ = (00100), |
| alpha$^3$ = (01000), | alpha$^4$ = (10000), | alpha$^5$ = (11101), | alpha$^6$ = (00111), |
| alpha$^7$ = (01110), | alpha$^8$ = (11100), | alpha$^9$ = (00101), | alpha$^{10}$ = (01010), |
| alpha$^{11}$ = (10100), | alpha$^{12}$ = (10101), | alpha$^{13}$ = (10111), | alpha$^{14}$ = (10011), |
| alpha$^{15}$ = (11011), | alpha$^{16}$ = (01011), | alpha$^{17}$ = (10110), | alpha$^{18}$ = (10001), |
| alpha$^{19}$ = (11111), | alpha$^{20}$ = (00011), | alpha$^{21}$ = (00110), | alpha$^{22}$ = (01100), |
| alpha$^{23}$ = (11000), | alpha$^{24}$ = (01101), | alpha$^{25}$ = (11010), | alpha$^{26}$ = (01001), |
| alpha$^{27}$ = (10010), | alpha$^{28}$ = (11001), | alpha$^{29}$ = (01111), | alpha$^{30}$ = (11110), |

The codeword C(33,2) for any given bsf/scn symbol pair (denoted by a polynomial of degree 32 over the elements of GF($2^5$)) may be generated from the elements of GF($2^5$) either by the following generator polynomial:

$G2(X) = X^{31}$ (+) alpha$^{7*}$ $X^{30}$ (+) alpha$^{27*}$ $X^{29}$ (+)

alpha$^{21*}$ $X^{28}$ (+) alpha$^{16*}$ $X^{27}$ (+) alpha$^{30*}$ $X^{26}$ (+)

alpha$^{22*}$ $X^{25}$ (+) alpha$^{18*}$ $X^{24}$ (+) alpha$^{17*}$ $X^{23}$ (+)

alpha$^{8*}$ $X^{22}$ (+) alpha$^{24*}$ $X^{21}$ (+) alpha$^{5*}$ $X^{20}$ (+)

alpha$^{23*}$ $X^{19}$ (+) alpha$^{20*}$ $X^{18}$ (+) alpha$^{10*}$ $X^{17}$ (+)

alpha$^{12*}$ $X^{16}$ (+) alpha$^{12*}$ $X^{15}$ (+) alpha$^{10*}$ $X^{14}$ (+)

alpha$^{20*}$ $X^{13}$ (+) alpha$^{23*}$ $X^{12}$ (+) alpha$^{5*}$ $X^{11}$ (+)

alpha$^{24*}$ $X^{10}$ (+) alpha$^{8*}$ $X^9$ (+) alpha$^{17*}$ $X^8$ (+)

alpha$^{18*}$ $X^7$ (+) alpha$^{22*}$ $X^6$ (+) alpha$^{30*}$ $X^5$ (+)

alpha$^{16*}$ $X^4$ (+) alpha$^{21*}$ $X^3$ (+) alpha$^{27*}$ $X^2$ (+)

alpha$^{7*}X$ (+) 1

(where * means multiplication) or by the following recursive polynomial:

$H2(X) = X^2$ (+) (alpha$^7$)*(X) (+) 1.

Figure 4:
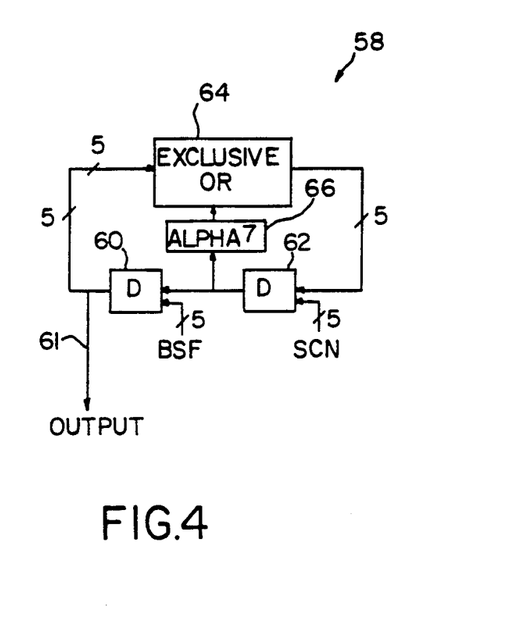
FIGS. 4, 5 are block diagrams of encoders.

In this case, the recursive polynomial is easier to implement, as follows. Referring to FIG. 4, in encoder 58, the bsf and scn symbols are initially entered respectively in a pair of one-symbol-interval delay elements 60, 62. The output 61 of delay element 60 is a stream of symbols making up C(33,2), with the highest order symbol in the codeword appearing first. The output of delay element 60 is also fed to an exclusive OR element 64, whose second input is the alpha$^7$ element of GF($2^5$) multiplied by the output of delay element 62. In FIG. 4, the block alpha$^7$ (labeled 66) performs the multiplication. The output of element 64 is in turn fed back to delay element 62. Encoder 58 is cycled 33 times to generate the 33 symbols of the codeword.

The codeword C(33,8) for any given header address similarly may be generated either by the following generator polynomial:

$G8(X) = X^{25}$ (+) alpha$^{18*}$ $X^{24}$ (+) alpha$^{28*}$ $X^{23}$ (+)

alpha$^{9*}$ $X^{22}$ (+) alpha$^{12*}$ $X^{21}$ (+) alpha$^{1*}$ $X^{20}$ (+)

alpha$^{25*}$ $X^{19}$ (+) alpha$^{23*}$ $X^{18}$ (+) alpha$^{15*}$ $X^{17}$ (+)

alpha$^{10*}$ $X^{16}$ (+) alpha$^{14*}$ $X^{15}$ (+) alpha$^{0*}$ $X^{14}$ (+)

alpha$^{15*}$ $X^{13}$ (+) alpha$^{15*}$ $X^{12}$ (+) alpha$^{0*}$ $X^{11}$ (+)

alpha$^{14*}$ $X^{10}$ (+) alpha$^{10*}$ $X^9$ (+) alpha$^{15*}$ $X^8$ (+)

alpha$^{23*}$ $X^7$ (+) alpha$^{25*}$ $X^6$ (+) alpha$^{1*}$ $X^5$ (+)

alpha$^{12*}$ $X^4$ (+) alpha$^{9*}$ $X^3$ (+) alpha$^{28*}$ $X^2$ (+)

alpha$^{18*}X$ (+) 1 or by the corresponding recursive polynomial:

$H8(X) = X^8$ (+) alpha$^{18*}X^7$ (+) alpha$^{2*}X^6$ (+)

alpha$^{5*}X^5$ (+) alpha$^{0*}X^4$ (+) alpha$^{5*}X^3$ (+)

alpha$^{2*}X^2$ (+) alpha$^{18*}X$ (+) 1.

Figure 5:
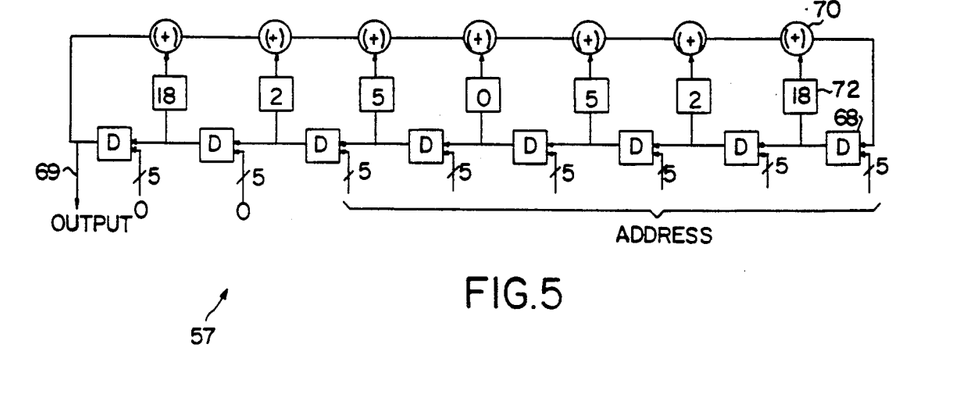

The encoder for C(33,8) may be configured either as an 8-stage linear shift register connected according to the recursive polynomial or a 25-stage linear shift register connected according to the generator polynomial. In the former case, referring to FIG. 5, the encoder 57 would include eight delay elements 68, eight exclusive OR elements 70, and eight multiply-by-alpha elements 72 (the number in each block 72 identifies the alpha value). Initially two leading zeroes and the six address symbols are loaded into the delay elements, the encoder is cycled 33 times, and the output 69 is C (33,8) beginning with the two high order zero symbols.

Figure 6:
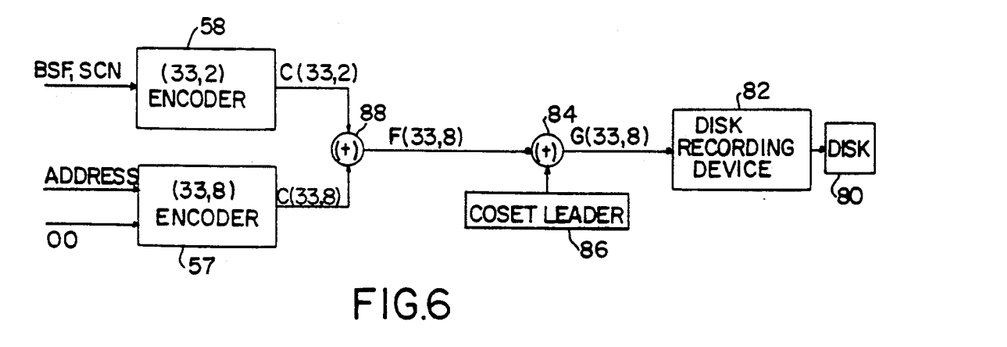
FIG. 6 is a block diagram of an encoding and recording circuit.

In summary, referring to FIG. 6, during manufacture a disk 80 is prerecorded by disk recording device 82 with headers that define the sectors of the disk. Each header is a word G(33,8) generated from an exclusive OR element 84 in which F(33,8) and a coset leader 86 are combined. F(33,8) is generated in exclusive OR element 88 from C(33,2) and C(33,8) which are derived from encoders 57, 58.

In use, each time the disk is to be accessed at a specific sector of a particular track, the headers of the successive sectors of the track are read and analyzed to find the desired sector. Each header address read from the disk need not be fully decoded, but merely analyzed sufficiently to be certain that it could be accurately and fully decoded to give the desired address. So long as the number of symbol errors is no greater than T, it is certain that the present sector is the desired one.

On the other hand, the bsf/scn symbols must be fully decoded in order to determine if the sector is good and to control the position of the head relative to the center line of the track. The bsf information may be used, for example, during a write operation, to avoid writing in a bad sector.

Figure 7:
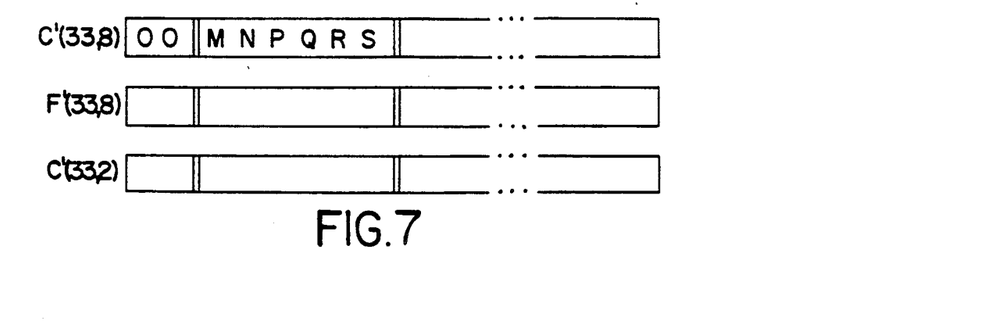
FIG. 7 is a diagram of three codewords
Figure 8:
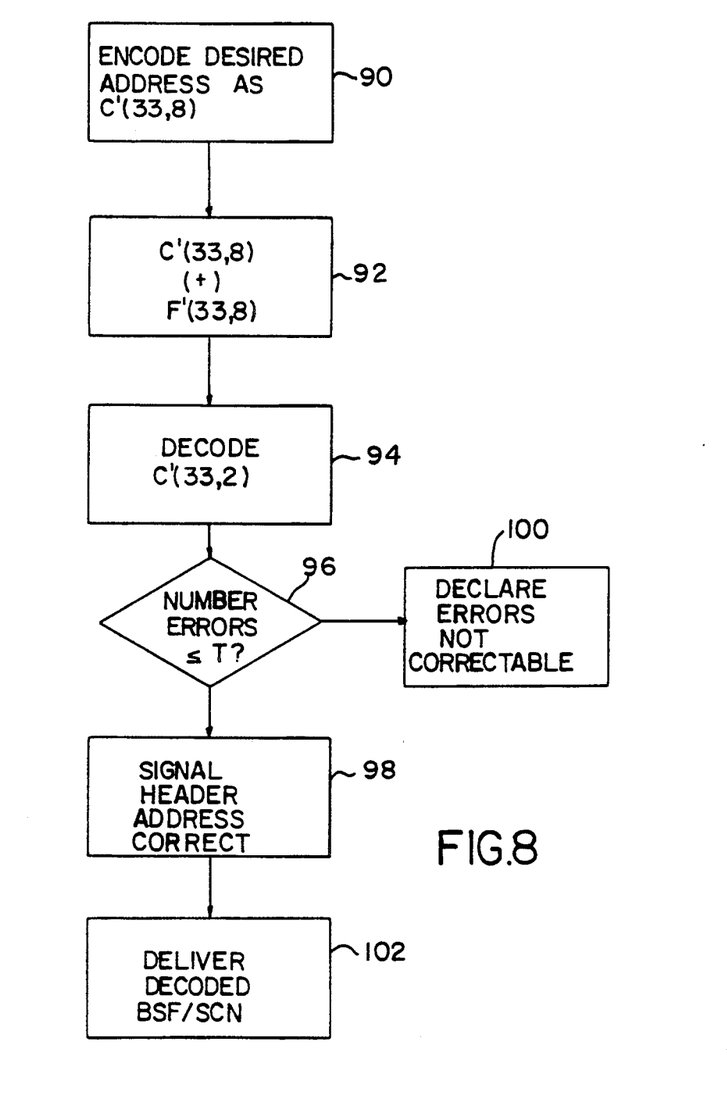
FIG. 8 is a flowchart of codeword decoding.
Figure 9:
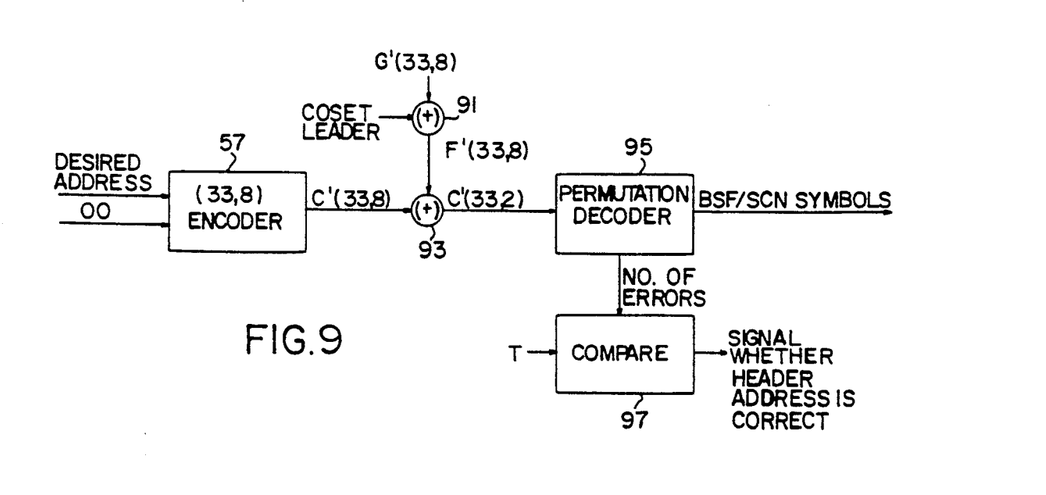
FIG. 9 is a block diagram of a decoding and sector identification circuit.

Referring to FIGS. 7, 8, 9, the first step in decoding is to generate (90) a prototype codeword C'(33,8) based on the six-symbol desired address, e.g., MNPQRS, using the same kind of encoder 57 as for encoding. Note that if there were no recording errors, C'(33,8) would equal C(33,8) for the sector being sought.

The next step is to exclusively OR (92) C'(33,8) with F'(33,8), the version of F(33,8) derived by reading the encoded header address G'(33,8) recorded on the disk. This is done in exclusive OR element 93. F'(33,8) is derived from G'(33,8) simply by exclusively ORing it with the original coset leader in exclusive OR element 91. Note that F'(33,8) will be a corrupted version of F(33,8) for example because of bit errors which may have occurred during reading of G(33,8) on the disk.

The exclusive OR step (92) strips from F'(33,8) the information contained in C'(33,8) and leaves a possibly corrupted version C'(33,2) of the original codeword C(33,2).

The next step is to decode (94) C'(33,2) over $GF(2^5)$ in permutation decoder 95 to generate a value equal to the number of symbol errors in the header (as described below).

Finally, the number of errors is compared (96) with a threshold T in a comparator 97. If the number of errors is no greater than T, the decoder signals that the header address is the one being sought (98) and the fully decoded values bsf and scn are delivered (102) to the disk controller. Otherwise the decoder signals (100) that the number of errors is too great for proper decoding, indicating either that the desired sector has not been reached or that the number of errors in the header of the desired sector is too great to be corrected.

This procedure works for the following reason.

Suppose that F'(33,8)=F(33,8), that is the retrieved codeword is uncorrupted relative to the originally generated codeword. Assume also that C'(33,8)=C(33,8), that is the current header address is the one being sought. Then stripping C'(33,8) from F'(33,8) will produce a C'(33,2) which is precisely the same as C(33,2). Decoding C'(33,2) will result in no symbol errors to be corrected, indicating that the desired sector has been found, and the first two symbols will be the bsf/scn symbol pair.

On the other hand, if C'(33,8) differs from C(33,8), (that is the current header address is not the one being sought) then C'(33,2) will not be a legitimate codeword of the (33,2) code but will be a legitimate codeword of the (33,8) code and thus will have a distance of at least 26 from any legitimate (33,2) codeword (because the (33,8) code has distance 26 and we know C'(33,2) is not a (33,2) codeword). That C'(33,2) is a (33,8) codeword is apparent from the fact that

C'(33,2)=C'(33,8) (+) C(33,8) (+) C(33,2)

because all three codewords C'(33,8), C(33,8) and C(33,2) are in the (33,8) code. Only under special conditions would C'(33,2) be a (33,2) codeword.

More generally, where F'(33,8) is not the same as F(33,8), if C'(33,2) is no farther than some number T symbols from a legitimate codeword C(33,2), then C'(33,2) may be presumed to be a corrupted version of a legitimate (33,2) codeword, thus implying that the header address used to derive C'(33,2) from F'(33,8) was the same one used to generate F(33,8) in the first place. Otherwise, the codeword C'(33,2) would not be a corrupted version of a legitimate codeword of the (33,2) code but rather a corrupted version of a legitimate codeword of the (33,8) code (because it is a concatenation of corrupted versions of legitimate (33,8) codewords), and would therefore be farther than T symbols from a legitimate C(33,2) codeword. The value T is chosen not as large as the number of symbols that can be corrected (judging from the minimum distance of the (33,2) code), but only as large as the number of symbols that might be corrected by the (33,8) code.

Figure 10:
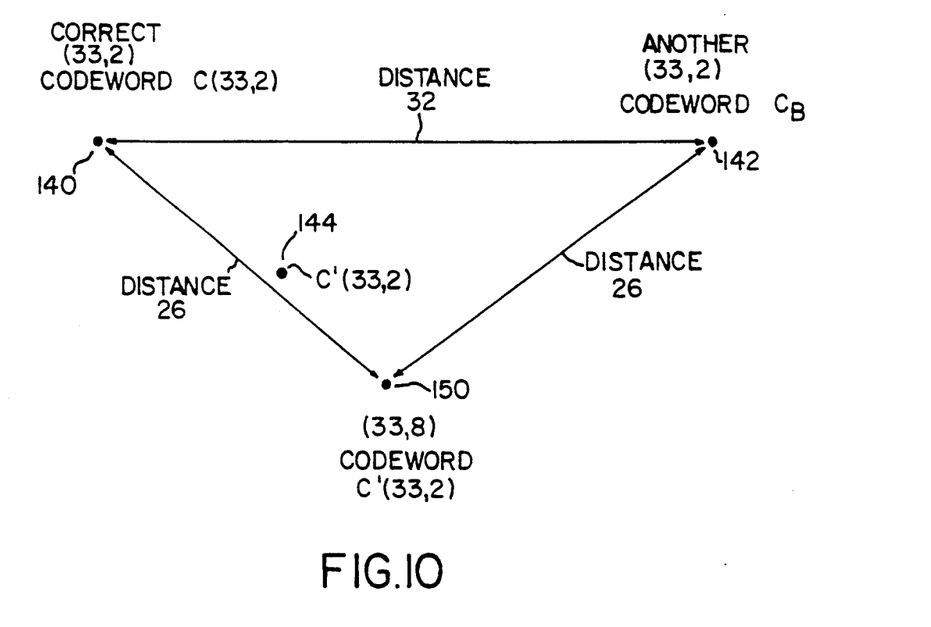
FIG. 10 is a diagram of the distance properties of two codes.

Referring to FIG. 10, the threshold T is chosen as follows. Suppose that the current sector is the one we are looking for, that is C'(33,2) is a corrupted version of a legitimate codeword C(33,2). Suppose, for example, that C'(33,2) lies at location 144 between two legitimate (33,2) codewords: the correct codeword C(33,2) (at location 140) and CB (at location 142). C(33,2) and CB are of course 32 apart so that C'(33,2) can be correctly decoded to C(33,2) provided there are no more than 15 erroneous symbols in C'(33,2). On the other hand, if the current sector is not the one being sought, then C'(33,2) will not be a corrupted version of a legitimate (33,2) codeword, but rather a corrupted version of a legitimate (33,8) codeword. Suppose that there are no recording errors so that C'(33,2) is in fact a (33,8) codeword, for example the one labeled 150 in FIG. 10. Recall that (33,2) codewords 140, 142 are also (33,8) codewords (the (33,2) codewords are a subset of the (33,8) codewords). Thus codeword 150 is only 26 away from codewords 120, 122. Therefore a corrupted codeword C'(33,2) 144 which is in fact a corrupted version of a legitimate codeword C(33,8) 150 but is still less than 15 away from codeword 140 would mistakenly be decoded to codeword 140 as indicating that the desired sector had been found even though in fact codeword 144 is a corrupted version of the (33,8) codeword 150. In order to prevent this error, the threshold T is set at 12, the maximum number of errors correctable by the (33,8) code.

In summary, because (33,8) codewords are closer together than (33,2) codewords, when we attempt to determine whether a given corrupted codeword is a (33,2) codeword we may only base the decision on a threshold distance that is the same as the distance of the (33,8) code. Otherwise, we may erroneously decode the corrupted codeword to a (33,2) codeword when in fact it should be decoded to a (33,8) codeword.

Figure 11:
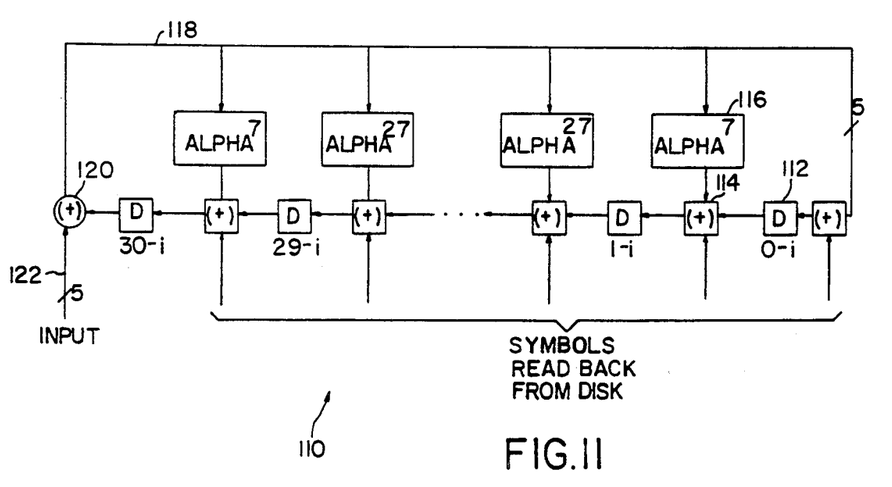
FIG. 11 is a block diagram of a decoder.
Figure 12:
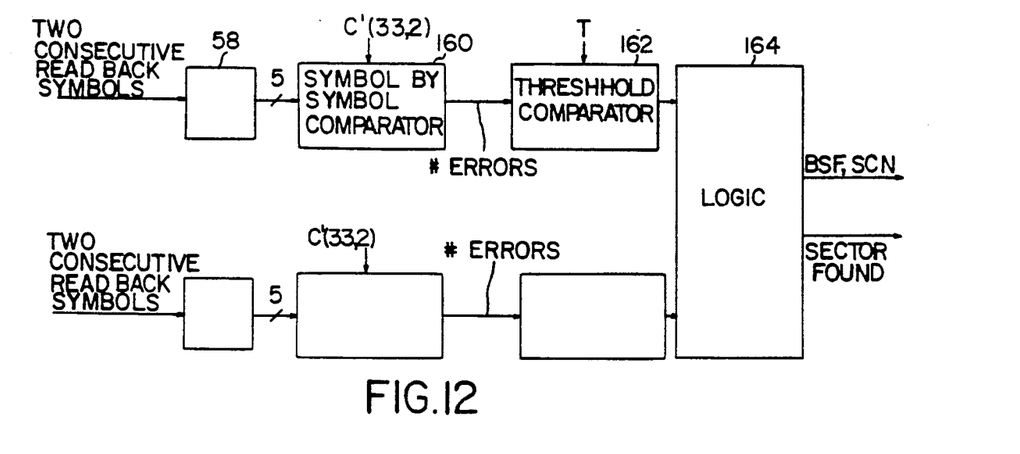
FIG. 12 is a flow chart for decoding a codeword.

Referring to FIGS. 11, 12, to accomplish the above procedure, C'(33,2) is decoded by a permutation decoder 110 which is like the encoder for the (33,2) code connected in accordance with the generator polynomial. The (33,2) code is completely decodable by permutation decoding. The goal of the permutation decoding is to find two correct adjacent symbols anywhere in the 33-symbol word. Decoder 110 is a linear feedback shift register of 31 delay elements 112 (numbered 30-i to 0-i respectively) with the delay elements separated by exclusive OR elements 114. The second input to each exclusive OR element is from an alpha block 116 which generates the product of the indicated alpha value times the value on line 118.

The left-most delay element feeds an exclusive OR element 120 whose other input is delivered on line 122. To begin decoding, the two high order symbols of C'(33,2) are fed (121) to input line 122. The alpha blocks 116 perform their multiplications and the results are exclusively ORed with the outputs of the respective delay elements (i.e., zero symbols); those results are stored in the next adjacent delay elements. The contents of the thirty-one delay elements represent the parity check symbols of the two symbols most recently fed in. The next step is to exclusively OR (in the exclusive OR elements 117) each of the 31 parity check symbols with the corresponding 31 parity check symbols in F'(33,8) retrieved from the disk. If there are no errors in F'(33,8) all of the 31 delay elements 112 will then contain zeros. If there are no more than T non-zero symbols in the 31 delay elements (123), then it is known (125) that the original two information symbols entered into the decoder were both correct and also that the C'(33,2) codeword is correctable within the required maximum T errors. The errors will be indicated by the non-zero symbols in the delay elements.

If the number of non-zero parity symbols in the delay elements exceeds the threshold T (indicating either that the two information symbols contain errors or that there are more than a correctable number of errors in the 31 parity symbols), the decoder is shifted (125) without entering any new symbols at input 122. After each even-numbered shift (i.e., shift 2, shift 4, . . . , shift 2T), the number of non-zero parity symbols is counted. If T or fewer non-zero parity symbols appear in the delay elements after a given shift (127), the scn and bsf symbols are corrected and delivered along with a signal indicating that the desired sector has been found (129). Otherwise, once 2*T shifts have been completed (131) the system signals that the errors are uncorrectable (133). (Note that there are a total of 2*T additional shifts without feeding in the input symbols; but only T of these 2*T shifts require that the non-zero symbols in the delay elements be counted. If the original contents of the delay elements is considered as shift 0, there are a total of 2*T+1 shifts, but only T+1 of the shifts, the even-numbered shifts, are to be counted.)

The bsf and scn symbols are corrected in the following way. If at shift i the count of the non-zero parity symbols is T or less, then all of the errors are confined to symbols 30−i through symbol −i. (By adding 33 to a negative symbol number one can identify the symbol by a non-negative integer between 0 and 32). The parity symbols contain the pattern of the symbol errors and the errors can be corrected. For example, if the count of non-zero parity symbols is T or less for shift i=4, then symbols 26, 25, . . . 1, 0, −1, . . . , −4, i.e., symbols 26, 25, . . . 1, 0, 33, . . . , 29, contain all of the errors.

In fact the only error patterns that need to be considered are those for symbols 32 and 31 (i.e., the two high order symbols corresponding to scn and bsf). The error patterns for those symbols are found by the following rule. If there are no more than T non-zero parity symbols at shift i then the error pattern for symbol 32 is symbol i−1 and the error pattern for symbol 31 is symbol i−2 of the delay elements. It i−1 is negative, then symbol 32 is error free.

Figure 13:
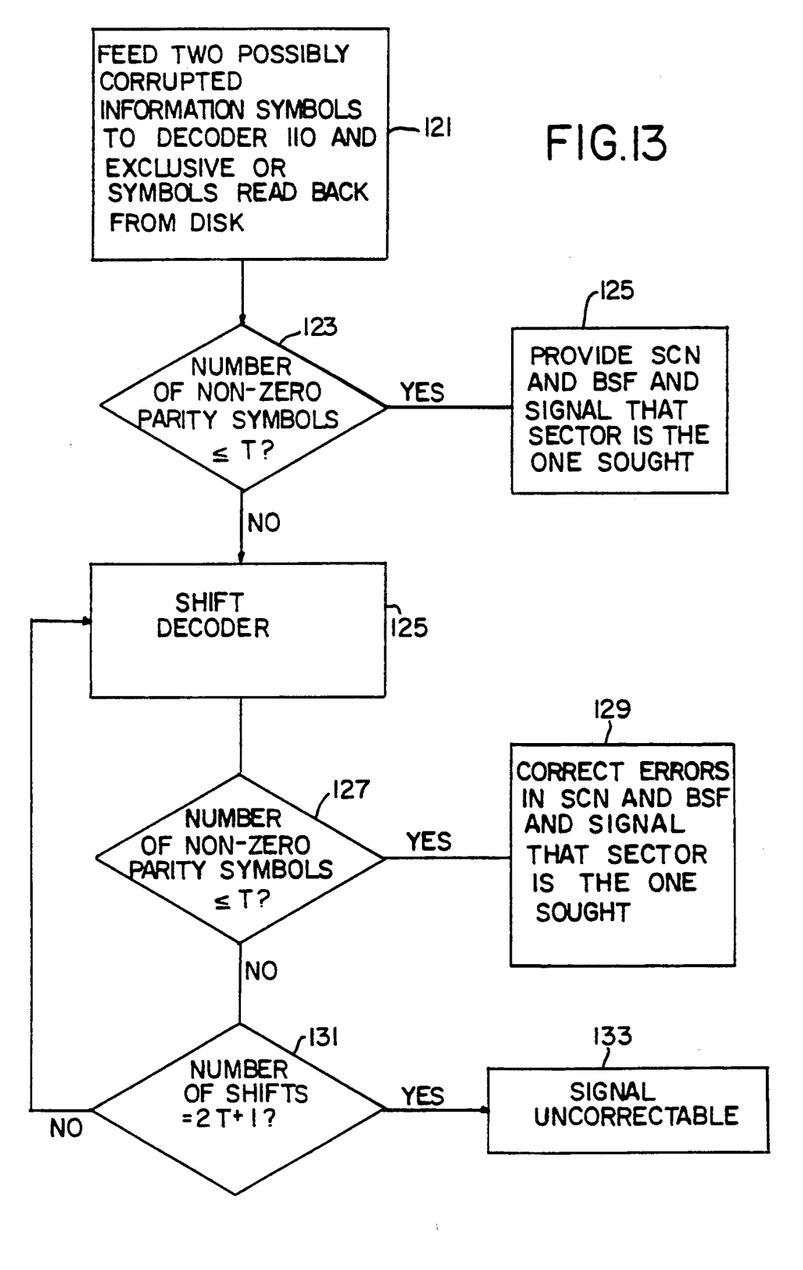
FIG. 13 is a block diagram of a parallel recursive decoder circuit.
Figure 14:
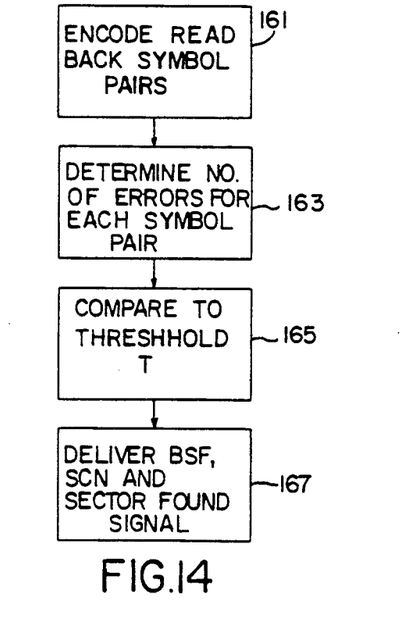
FIG. 14 is a flow chart corresponding to FIG. 13.

Referring to FIGS. 13, 14, alternatively, decoding may be accomplished using encoders configured according to the recursive polynomial as in FIG. 4. A dedicated encoder 58 is provided for encoding each one of 33 different pairs as a (33,2) codeword (161). Each of the 33 different pairs is one of the adjacent two symbols in the codeword C'(33,2). The qth encoded codeword is them compared to C'(33,2) in a comparator 160 to determine the number of symbol errors (163). The number of symbol errors is then compared (165) with the threshold T in a comparator 162. The outputs of all comparators 162 are connected to logic 164. If all of the outputs of comparators 162 indicate that the threshold has been exceeded then logic 164 signals that the errors are uncorrectable. Otherwise logic 164 signals that the desired sector has been found and delivers the values of bsf and scn corresponding to the possible symbol pair that produced the sufficiently low number of symbol errors (167).

During a startup mode, when the header address is usually not known in advance, in order to recover the bsf and scn symbols, the code must be decoded as a (33,8) code. Depending on the number of errors to be corrected, there are several possible approaches.

For correcting three symbol errors, the first 32 symbols are divided into four sets of eight symbols each. With no more than three symbol errors this guarantees that at least one of the eight-symbol sets is error free. The permutation decoding is done by finding the error-free symbol set using an encoder configured either serially in accordance with G8(X) or in parallel (as in FIG. 13) in accordance with the recursive polynomial H8(X). Once found, all errors in the thirty-three symbol word can be corrected.

For correcting four symbol errors, one could take the approach of multiple parallel permutation decoders each applied to one of the possible eight consecutive symbol strings, but the added complexity would only be able to correct one additional error. Even more complexity would be required for decoding 5, 6, 7, 8, 9, 10, 11 or 12 errors.

A full decoder for correcting twelve errors is also possible. The decoding is done over $GF(2^{10})$ rather than over $GF(2^5)$.

Additional discussion of (33,K) codes may be found at Section 5, chapter 11 of MacWilliams and Sloane, *The Theory of Error-Correcting Codes* (North Holland, New York, 1977).

Other embodiments are within the following claims.

I claim:

1. A method for determining whether particular information was used in encoding a previously encoded codeword, said previously encoded codeword having been formed by encoding information as a first preliminary code sequence in accordance with a first code, and combining said first preliminary code sequence with a second preliminary code sequence generated in accordance with a second code, said method comprising encoding said particular information as a particular first preliminary code sequence in accordance with said first code, stripping said particular first preliminary code sequence from said previously encoded codeword to derive a test sequence, decoding said test sequence in accordance with said second code, and determining, based on said decoding, whether said particular information was used in encoding said previously encoded codeword, wherein the legitimate code sequences of said second code are a subset of the legitimate code sequences of said first code.

2. A method for determining whether particular information was used in encoding a previously encoded codeword, said previously encoded codeword having been formed by encoding information as a first preliminary code sequence in accordance with a first code, and combining said first preliminary code sequence with a second preliminary code sequence generated in accordance with a second code, said method comprising encoding said particular information as a particular first preliminary code sequence in accordance with said first code, stripping said particular first preliminary code sequence from said previously encoded codeword to derive a test sequence, decoding said test sequence in accordance with said second code, and determining, based on said decoding, whether said particular information was used in encoding said previously encoded codeword, wherein said previously encoded codeword is a legitimate code sequence of said first code.

3. A method for determining whether particular information was used in encoding a previously encoded codeword, said previously encoded codeword having been formed by encoding information as a first preliminary code sequence in accordance with a first code, and combining said first preliminary code sequence with a second preliminary code sequence generated in accordance with a second code, said method comprising encoding said particular information as a particular first preliminary code sequence in accordance with said first code, stripping said particular first preliminary code sequence from said previously encoded codeword to derive a test sequence, decoding said test sequence in accordance with said second code, and determining, based on said decoding, whether said particular information was used in encoding said previously encoded codeword, wherein said previously encoded codeword is not systematic with respect to said information.

4. A method for determining whether particular information was used in encoding a previously encoded codeword, said previously encoded codeword having been formed by encoding information as a first preliminary code sequence in accordance with a first code, and combining said first preliminary code sequence with a second preliminary code sequence generated in accordance with a second code, said method comprising encoding said particular information as a particular first preliminary code sequence in accordance with said first code, stripping said particular first preliminary code sequence from said previously encoded codeword to derive a test sequence, decoding said test sequence in accordance with said second code, and determining, based on said decoding, whether said particular information was used in encoding said previously encoded codeword, wherein said first code is a cyclic error correcting (n,k) code and said second code is a cyclic error correcting (n,m) code where m is smaller than k.

5. A method for determining whether particular information was used in encoding a previously encoded codeword, said previously encoded codeword having been formed by encoding information as a first preliminary code sequence in accordance with a first code, and combining said first preliminary code sequence with a second preliminary code sequence generated in accordance with a second code, said method comprising encoding said particular information as a particular first preliminary code sequence in accordance with said first code, stripping said particular first preliminary code sequence from said previously encoded codeword to derive a test sequence, decoding said test sequence in accordance with said second code, and determining, based on said decoding, whether said particular information was used in encoding said previously encoded codeword, wherein said second code can be fully decoded by permutation decoding but said first code can not be fully decoded by permutation decoding.

6. A method for determining whether particular information was used in encoding a previously encoded codeword, said previously encoded codeword having been formed by encoding information as a first preliminary code sequence in accordance with a first code, and combining said first preliminary code sequence with a second preliminary code sequence generated in accordance with a second code, said method comprising encoding said particular information as a particular first preliminary code sequence in accordance with said first code, stripping said particular first preliminary code sequence from said previously encoded codeword to derive a test sequence, decoding said test sequence in accordance with said second code, and determining, based on said decoding, whether said particular information was used in encoding said previously encoded codeword, wherein said first code is rate (33,8) code and said second code is a (33,2) code.

7. A method for determining whether particular information was used in encoding a previously encoded codeword and reconstructing additional information from said previously encoded codeword, said previously encoded codeword having been formed by encoding information as a first preliminary code sequence in accordance with a first code, encoding additional information in a second preliminary code sequence in accordance with a second code, and combining said first preliminary code sequence with said second preliminary code sequence, said method comprising encoding said particular information as a particular first preliminary code sequence in accordance with said first code, stripping said particular first preliminary code sequence from said previously encoded codeword to derive a test sequence, decoding said test sequence in accordance with said second code, determining, based on said decoding, whether said particular information was used in encoding said previously encoded codeword, and if said particular information was used in encoding said previously encoded codeword, reconstructing said additional information based on said decoding.

8. The method of claim 7 wherein said additional information comprises a bad sector flag for a magnetic disk.

9. The method of claim 7 wherein said additional information comprises a servo correction number for a magnetic disk.

10. The method of claim 7 wherein said second code is systematic with respect to said additional information.

11. The method of claim 7 wherein said codeword comprises a string of an symbols, the high order m said symbols being said additional information.

12. The method of claim 7 wherein said decoding comprises encoding simultaneously in parallel in accordance with said second code possible code sequences corresponding to each possible value of said additional information, and comparing simultaneously in parallel each possible code sequence with said test sequence.

13. A method for determining whether particular information was used in encoding a previously encoded codeword, said previously encoded codeword having been formed by encoding information as a first preliminary code sequence in accordance with a first code, and combining said first preliminary code sequence with a second preliminary code sequence generated in accordance with a second code, said method comprising encoding said particular information as a particular first preliminary code sequence in accordance with said first code, stripping said particular first preliminary code sequence from said previously encoded codeword to derive a test sequence, decoding said test sequence in accordance with said second code, and determining, based on said decoding, whether said particular information was used in encoding said previously encoded codeword, wherein said first preliminary code sequence comprises a string of A symbols, the high order k said symbols comprising at least one zero symbol followed by said information.

14. A method for determining whether particular information was used in encoding a previously encoded codeword, said previously encoded codeword having been formed by encoding information as a first preliminary code sequence in accordance with a first code, and combining aid first preliminary code sequence with a second preliminary code sequence generated in accordance with a second code, said method comprising encoding said particular information as a particular first preliminary code sequence in accordance with said first code, stripping said particular first preliminary code sequence from said previously encoded codeword to derive a test sequence, decoding said test sequence in accordance with said second code, and determining, based on said decoding, whether said particular information was used in encoding said previously encoded codeword, wherein said decoding comprises permutation decoding over a field of finite elements having fewer elements than the field that would be required for fully decoding said previously encoded codeword.

15. A method for determining whether particular information was used in encoding a previously encoded codeword, said previously encoded codeword having been formed by encoding information as a first preliminary code sequence in accordance with a first code, and combining said first preliminary code sequence with a second preliminary code sequence generated in accordance with a second code, said method comprising encoding said particular information as a particular first preliminary code sequence in accordance with said first code, stripping said particular first preliminary code sequence from said previously encoded codeword to derive a test sequence, decoding said test sequence in accordance with said second code, and determining, based on said decoding, whether said particular information was used in encoding said previously encoded codeword, wherein said determining comprises detecting the distance between said test sequence and legitimate code sequences of said second code.

16. The method of claim 15 wherein said determining further comprises comparing said distance with a predetermined threshold value.

17. The method of claim 16 wherein said predetermined threshold has a maximum value that is smaller than the error correcting capability of said second code.

18. The method of claim 17 wherein said predetermined threshold is the same as the error correcting capability of said first code.

19. A method for determining whether particular information was used in encoding a previously encoded codeword, said previously encoded codeword having been formed by encoding information as a first preliminary code sequence in accordance with a first code, and combining said first preliminary code sequence with a second preliminary code sequence generated in accordance with a second code, said method comprising encoding said particular information as a particular first preliminary code sequence in accordance with said first code, stripping said particular first preliminary code sequence from said previously encoded codeword to derive a test sequence, decoding said test sequence in accordance with said second code, and determining, based on said decoding, whether said particular information was used in encoding said previously encoded codeword, wherein said first and second codes comprise maximum distance separable codes, said first code having a smaller distance than said second code.

20. A method for encoding bad sector, servo correction, and sector address values for storage in a header associated with a sector of storage on a storage medium comprising encoding the address value with leading zero symbols in accordance with a first code having a first rate to form a first preliminary code sequence, encoding the bad sector and servo correction values in a systematic second code having a second rate to form a second preliminary code sequence, and combining said first and second preliminary code sequences to generate a codeword of said first code such that said bad sector and servo correction values appear explicitly in said codeword but said sector address value does not appear explicitly in said codeword.

21. The apparatus of claim 20, wherein said codeword may be subjected to no more than a predetermined degree of corruption.

22. A method of locating a sector from among sectors on a magnetic disk comprising encoding the respective addresses of said sectors as first preliminary code sequences in accordance with a first code, forming codewords for said sectors based on combining said first preliminary code sequences with second preliminary code sequences generated in accordance with a second code, recording said codewords in said sectors during formatting of said magnetic disk, reading one of said codewords, possibly corrupted, from a sector rotating under a head, stripping the first preliminary code sequence of said sector being located from said possibly corrupted codeword to derive a test sequence, decoding said test sequence in accordance with said second code to determine the number of errors in said possibly corrupted codeword, comparing said number of errors to a threshold T, and if the number of errors is no greater than T, accepting said sector rotating under said head as the one being sought, otherwise proceeding to the next sector.

23. A method of checking whether a sector of a magnetic disk to be written during a write operation should be written comprising encoding the respective addresses of said sectors as first preliminary code sequences in accordance with a first code, forming codewords for said sectors based on combining said first preliminary code sequences with second preliminary code sequences generated from bad sector information indicating whether the respective sectors should be written, in accordance with a second code, recording said codewords in said sectors during formatting of said magnetic disk, reading one of said codewords, possibly corrupted, from a sector rotating under a head, stripping the first preliminary code sequence of the sector to be written from said possibly corrupted codeword to derive a test sequence, decoding said test sequence in accordance with said second code to determine the number of errors in said possibly corrupted codeword, comparing said number of errors to a threshold T, if the number of errors is no greater than T, accepting the sector rotating under said head as the one to be written, and checking the thus decoded bad sector information to determine whether said sector should be written, otherwise proceeding to the next sector.

24. A method of locating a sector of a track of a magnetic disk and centering a head on said track comprising encoding the respective addresses of the sectors of said track as first preliminary code sequences in accordance with a first code, forming codewords for said sectors based on combining said first preliminary code sequences with second preliminary code sequences generated from servo control information about the location of the center of said track, in accordance with a second code, recording said codewords in said sectors during formatting of said magnetic disk, reading one of said codewords, possibly corrupted, from a sector rotating under said head, stripping the first preliminary code sequence of said sector being located from said possibly corrupted codeword to derive a test sequence, decoding said test sequence in accordance with said second code to determine the number of errors in said possibly corrupted codeword, comparing said number of errors to a threshold T, and if the number of errors is no greater than T, accepting said sector rotating under said head as the one being sought, deriving said servo control information from said test sequence and using the thus derived servo control information to control the location of said head.

* * * * *